(12) United States Patent
Seeburger

(10) Patent No.: US 8,593,159 B2
(45) Date of Patent: Nov. 26, 2013

(54) SWITCHING CONFIGURATION FOR DETERMINING THE CAPACITANCE OF A CAPACITIVE SENSOR ELEMENT

(75) Inventor: Günther Seeburger, Donaueschingen (DE)

(73) Assignee: E.G.O. Control Systems GmbH, Balingen (DE)

( * ) Notice: Subject to any disclaimer, the term of this patent is extended or adjusted under 35 U.S.C. 154(b) by 717 days.

(21) Appl. No.: 12/725,769

(22) Filed: Mar. 17, 2010

(65) Prior Publication Data
US 2010/0237882 A1    Sep. 23, 2010

(30) Foreign Application Priority Data

Mar. 19, 2009  (DE) .................. 10 2009 013 532

(51) Int. Cl.
*G01R 27/26*    (2006.01)
(52) U.S. Cl.
USPC ............ 324/658; 324/686; 324/519; 324/548
(58) Field of Classification Search
USPC ................. 324/661, 662, 686, 519, 548, 658; 345/173, 174; 178/18.06, 19.03
See application file for complete search history.

(56) References Cited

U.S. PATENT DOCUMENTS

| | | | | |
|---|---|---|---|---|
| 3,639,897 A * | 2/1972 | Teich | | 340/430 |
| 3,958,239 A * | 5/1976 | Green | | 341/24 |
| 4,088,904 A * | 5/1978 | Green | | 307/116 |
| 5,973,417 A | 10/1999 | Goetz et al. | | |
| 6,518,820 B2 * | 2/2003 | Gremm | | 327/432 |
| 7,479,791 B2 * | 1/2009 | Kraus | | 324/678 |
| 7,782,069 B2 * | 8/2010 | Klopfer | | 324/686 |
| 7,791,356 B2 * | 9/2010 | Grosser et al. | | 324/662 |
| 7,834,856 B2 * | 11/2010 | Grinshpoon et al. | | 345/173 |
| 7,843,200 B2 * | 11/2010 | Klopfer | | 324/662 |
| 7,950,292 B2 * | 5/2011 | Harada et al. | | 73/861.12 |
| 2006/0055679 A1 * | 3/2006 | Grinshpoon et al. | | 345/173 |
| 2006/0238233 A1 * | 10/2006 | Kraus | | 327/517 |

(Continued)

FOREIGN PATENT DOCUMENTS

DE    10 2004 003 112 A1    8/2005
DE    10 2005 024 772 A1    11/2006

(Continued)

OTHER PUBLICATIONS

Search Report for corresponding European Application No. 10156337.7 dated Aug. 10, 2010.
German Office Action for German Application No. 10 2009 013 532.4.

*Primary Examiner* — Arleen M Vazquez
*Assistant Examiner* — Alesa Allgood
(74) *Attorney, Agent, or Firm* — Alston & Bird LLP

(57) ABSTRACT

A circuit arrangement for determining a capacitance of a capacitive sensor element (C1) includes a square-wave voltage source (10) which is designed to output a square-wave voltage (UR) at an output connection (11), a sensor branch via which the square-wave voltage is applied to the sensor element, and an amplifier branch including a negative feedback resistor (R1), a transistor (T1) and an evaluation capacitor (C2), the negative feedback resistor, the transistor and the evaluation capacitor being looped-in in series between the output connection of the square-wave voltage source and a reference potential (GND), and a voltage (UOUT), which is a measure of the capacitance of the sensor element, being applied to the evaluation capacitor.

5 Claims, 2 Drawing Sheets

(56) References Cited

U.S. PATENT DOCUMENTS

2007/0181412 A1    8/2007    Raunig
2008/0157893 A1*   7/2008    Krah .......................... 331/177 R
2008/0238444 A1*   10/2008   Klopfer ........................ 324/662
2008/0246494 A1    10/2008   Grosser et al.

FOREIGN PATENT DOCUMENTS

| | | |
|---|---|---|
| EP | 1 204 209 A1 | 5/2002 |
| WO | WO 98/26506 | 6/1998 |
| WO | WO 2005/071361 A1 | 8/2005 |
| WO | WO 2006/122768 A1 | 11/2006 |

* cited by examiner

SWITCHING CONFIGURATION FOR DETERMINING THE CAPACITANCE OF A CAPACITIVE SENSOR ELEMENT

CROSS REFERENCE TO RELATED APPLICATIONS

This application claims priority to German Application Number 10 2009 013 532.4, filed on Mar. 19, 2009, the contents of which are incorporated by reference for all that it teaches.

FIELD OF THE INVENTION

The invention relates to a circuit arrangement for determining a capacitance of a capacitive sensor element.

BACKGROUND OF THE INVENTION

Circuit arrangements for evaluating capacitive sensor elements, for example in the form of capacitive proximity switches, are known and have, for example in EP 0 859 468 A1, a capacitive sensor element whose capacitance changes on the basis of its actuating state. This change in capacitance is evaluated in order to determine the actuating state.

The invention is based on addressing the problem of providing a circuit arrangement for determining a capacitance of a capacitive sensor element, which circuit arrangement ensures reliable determination of the capacitance under all operating conditions, can be produced in a cost-effective manner and is insensitive to EMC and RF interference.

SUMMARY

The invention solves this problem in one embodiment by means of a circuit arrangement having the features as claimed herein. The further claims relate to advantageous and preferred refinements of the invention which are explained in more detail below. The wording of the claims is incorporated in the content of the description by express reference.

The inventive circuit arrangement for determining a capacitance of a capacitive sensor element comprises a square-wave voltage source which is designed to output a square-wave voltage at an output connection, a sensor branch via which the square-wave voltage is applied to the sensor element, a sensor variable, for example a sensor current, preferably being transmitted via the sensor branch, and an amplifier branch, in particular for amplifying the sensor variable, for example for amplifying the sensor current, comprising a negative feedback resistor, a transistor and an evaluation capacitor, the negative feedback resistor, the transistor and the evaluation capacitor being looped-in in series between the output connection of the square-wave voltage source and a reference potential, and a voltage, which is a measure of the capacitance of the sensor element, being applied to the evaluation capacitor, in particular to a connecting node between the transistor and the evaluation capacitor. The negative feedback resistor in the amplifier branch reduces the sensitivity of the circuit to component variations, for example to parameter variations of the transistor, that is to say the transistor may be an unselected transistor for example.

In one embodiment, the square-wave voltage source comprises a charge pump. Alternatively, the square-wave voltage source may also comprise a voltage multiplier circuit, for example a high-voltage cascade or a Villard multiplier circuit.

In one embodiment, the square-wave voltage source is designed to output a square-wave voltage with a voltage swing of greater than 20 V, preferably greater than 30 V. The square-wave voltage source is particularly preferably designed to output a square-wave voltage with a voltage swing of 35 V. In the present case, the term voltage swing is understood as meaning the voltage difference or potential difference between the two different voltage states of the square-wave voltage. The comparatively large voltage swing compensates for the gain reduction caused by the negative feedback resistor. The combination of negative feedback and a large voltage swing enables a constant or increased evaluation sensitivity with a reduced sensitivity of the circuit to component variations.

In one embodiment, the square-wave voltage source comprises a zener diode which is looped in between the output connection of the square-wave voltage source and the reference potential and limits the square-wave voltage to a maximum voltage level.

In one embodiment, the transistor is a pnp transistor, the negative feedback resistor, the emitter-collector path of the transistor and the evaluation capacitor being looped-in in series between the output connection of the square-wave voltage source and the reference potential, and the base connection of the transistor being connected to a connection of the capacitive sensor element.

One embodiment provides a discharge resistor which is connected in parallel with the evaluation capacitor. The discharge resistor continuously discharges the evaluation capacitor, with the result that an average voltage which depends on the capacitance of the sensor element is established across the evaluation capacitor.

One embodiment provides a diode which is looped-in in the forward direction between the transistor and the evaluation capacitor. The diode prevents the evaluation capacitor being discharged during intervals of time in which the square-wave voltage has a low level, and thus increases the evaluation sensitivity. The diode may be in the form of a transistor which is connected as a diode. The abovementioned transistor and the transistor which is connected as a diode are preferably part of a double transistor for this case.

One embodiment provides a voltage divider, the voltage divider being looped in between the output connection of the square-wave voltage source and a connection of the capacitive sensor element, a centre tap of the voltage divider being connected to a control input of the transistor. The voltage divider is used to attenuate interference.

BRIEF DESCRIPTION OF THE DRAWINGS

Advantageous embodiments of the invention are schematically illustrated in the drawings and are described below, wherein.

DETAILED DESCRIPTION

Figure 1:
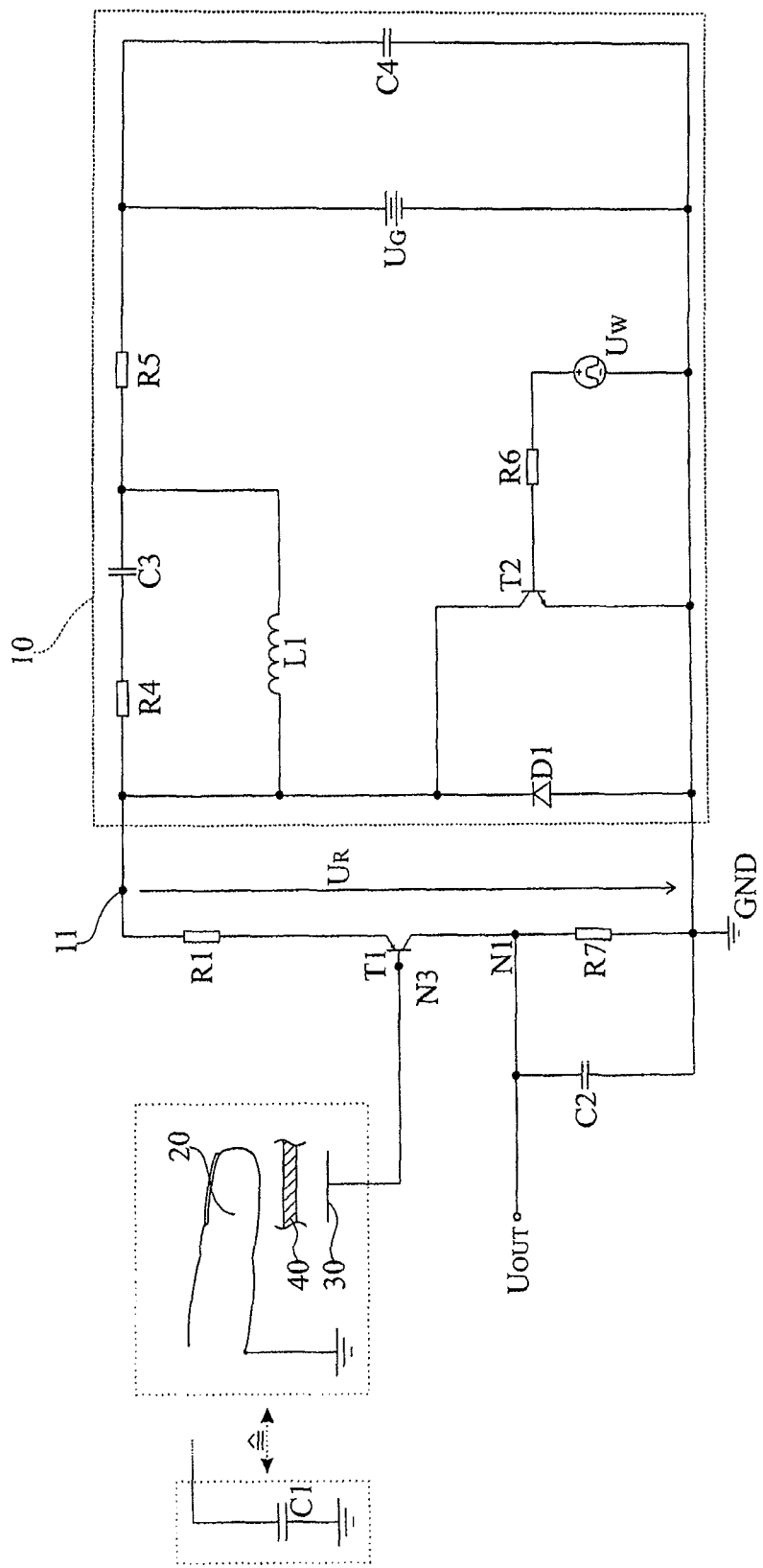
FIG. 1 shows a circuit diagram of a first embodiment of a circuit arrangement for determining a capacitance of a capacitive sensor element whose capacitance changes on the basis of its actuating state.

FIG. 1 shows a circuit diagram of a first embodiment of a circuit arrangement for determining a capacitance of a capacitive sensor element C1 whose capacitance changes on the basis of its actuating state.

The capacitive sensor element forms a capacitor C1, a first capacitor plate 30 being formed, for example, by a conductive, planar and flat layer which may be arranged under a glass ceramic plate of a hob, a non-conductive control panel material etc. 40. A second capacitor plate is formed, for example, by a user's finger 20 or by the user himself. The glass ceramic plate or the control panel material 40 forms a dielectric between the two capacitor plates. The capacitive sensor element is represented by its electrical equivalent circuit diagram in the form of the capacitor C1.

The circuit arrangement comprises a square-wave voltage source 10 which is designed to output a square-wave voltage UR with a voltage swing of 35 V at an output connection 11. In this case, the square-wave voltage UR assumes two different voltage states, namely a first voltage state with a voltage level of 0 V and a second voltage state with a voltage level of 35 V, and consequently has a voltage swing of 35 V.

The square-wave voltage source 10 comprises a DC voltage source UG which outputs a DC voltage, for example 5 V, an optional buffer capacitor C4 being connected in parallel with the DC voltage source UG. A coil L1, resistors R4 and R5, a capacitor C3, a transistor T2 which is driven by a signal source UW via a series resistor R6, and a zener diode D1 having a zener voltage of 39 V form, in the connection illustrated, a charge pump for generating the square-wave voltage UR. The signal source UW may be implemented, for example, in one embodiment, in the form of a microprocessor port which generates a square-wave signal at a frequency in the range of 5 kHz to 40 kHz, preferably 10 kHz to 20 kHz. A quiescent level adaptation or an adjustment of a voltage UOUT, which is a measure of the capacitance of the sensor element C1, can be carried out by setting a suitable duty ratio of the square-wave signal output by the signal source UW.

The zener diode D1 which is looped in between the output connection 11 of the square-wave voltage source 10 and the reference potential GND limits the square-wave voltage UR to a maximum voltage level of 39 V.

An amplifier branch of the circuit arrangement comprises a negative feedback resistor R1, a pnp transistor T1, an evaluation capacitor C2 and a discharge resistor R7 which is connected in parallel with the evaluation capacitor C2, the negative feedback resistor R1, the emitter-collector path of the pnp transistor T1 and the evaluation capacitor C2 and/or the discharge resistor R7 being looped-in in series between the output connection 11 of the square-wave voltage source 10 and the reference potential GND. The voltage UOUT which is a measure of the capacitance of the sensor element C1 is applied to a connecting node N1 between the transistor T1 or the collector of the transistor T1 and the evaluation capacitor C2.

A sensor branch of the circuit arrangement, via which the square-wave voltage UR is applied to the sensor element C1, is formed by the negative feedback resistor R1 and the emitter-base junction of the transistor T1. A current in the sensor branch, that is to say the current through the emitter-base junction of the transistor T1, is accordingly amplified by the transistor T1, the evaluation capacitor C2 being charged by the collector current of the transistor T1. The discharge resistor R7 causes continuous discharging to be carried out.

When the capacitive sensor element C1 is actuated, its capacitance increases, as a result of which the current in the sensor branch or the current through the emitter-base junction of the transistor T1 increases for the high state of the square-wave voltage UR. When amplified in a corresponding manner, this increases the collector current, as a result of which the voltage UOUT likewise increases. The voltage level of the voltage UOUT is consequently a measure of the capacitance of the sensor element C1. It is also possible to determine whether or not the capacitive sensor element C1 has been actuated by evaluating the voltage UOUT, for example by comparing it with a predefined voltage threshold value. The circuit arrangement shown is consequently also suitable for determining the actuating state of the capacitive sensor element C1.

Figure 2:
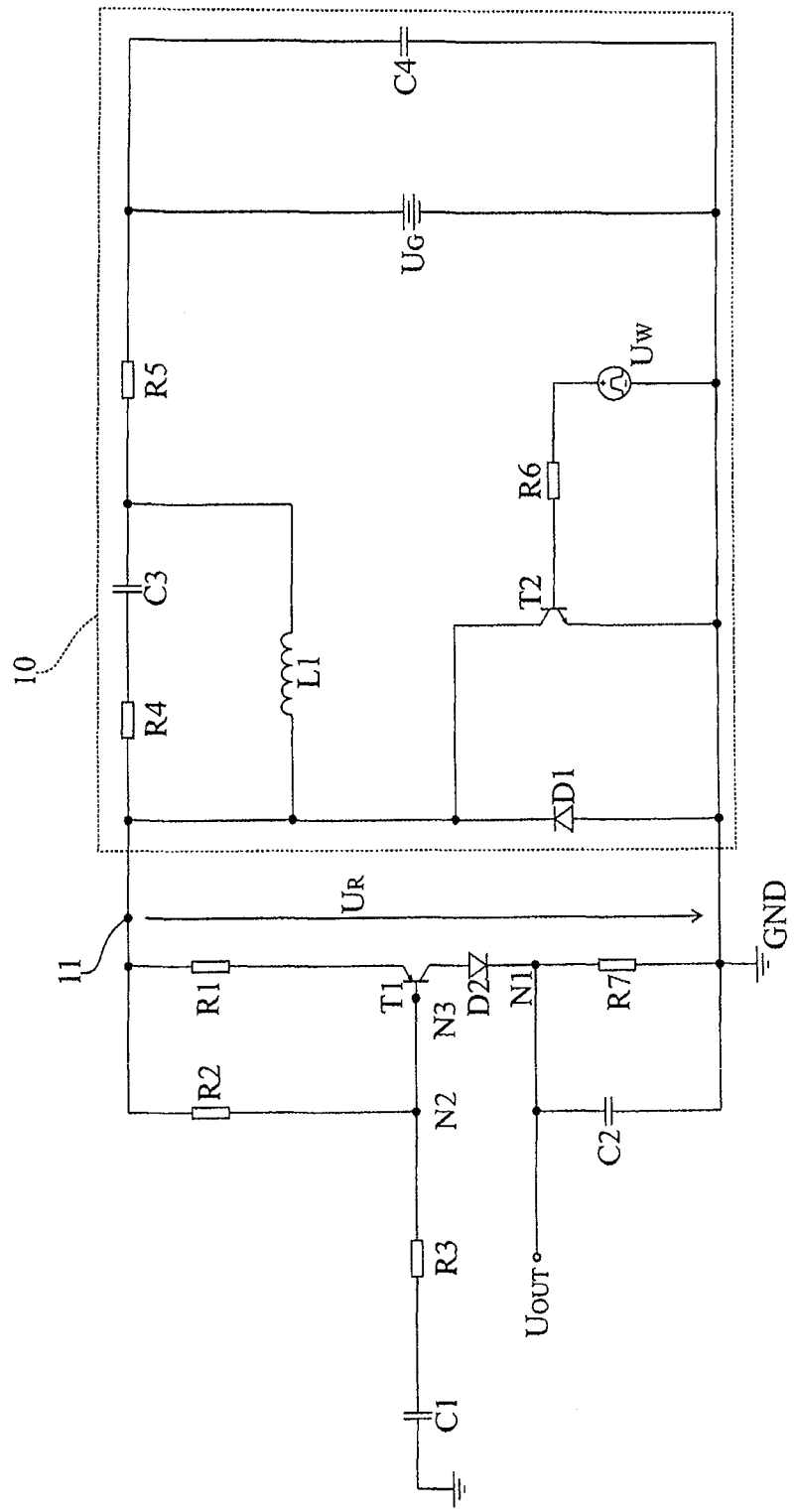
FIG. 2 shows a circuit diagram of another embodiment of a circuit arrangement for determining a capacitance of a capacitive sensor element whose capacitance changes on the basis of its actuating state.

FIG. 2 shows a circuit diagram of another embodiment of a circuit arrangement for determining a capacitance of the capacitive sensor element C1 whose capacitance changes on the basis of its actuating state. Only the differences from the circuit shown in FIG. 1 are described below; reference is consequently made to FIG. 1 with respect to the corresponding components.

The amplifier branch also comprises a diode D2 which is looped in in the forward direction between the transistor T1 and the evaluation capacitor C2 and/or the discharge resistor R7. The diode D2 prevents the evaluation capacitor C2 being discharged via the transistor T1 during intervals of time in which the square-wave voltage UR has a low level, that is to say 0 V, and thus increases the evaluation sensitivity. The diode D2 may be in the form of a transistor which is connected as a diode. The transistor T1 and the transistor which is connected as a diode are preferably part of a double transistor for this case.

A voltage divider comprising resistors R2 and R3 is also provided, the voltage divider being looped in in between the output connection 11 of the square-wave voltage source 10 and a connection or the first capacitor plate 30 of the capacitive sensor element C1. A centre tap N2 of the voltage divider is connected to the base connection N3 of the transistor T1. The voltage divider is used to attenuate interference.

It goes without saying that the circuit arrangements shown in the embodiments may also be extended in order to determine a capacitance of a plurality of capacitive sensor elements by respectively providing, for each sensor element, a sensor branch and an amplifier branch to which the square-wave voltage UR is applied by the square-wave voltage source 10 which needs to be provided only singly.

The embodiments shown ensure that the capacitance is determined reliably under all operating conditions, can be produced in a cost-effective manner and are insensitive to EMC and RF interference.

The invention claimed is:

1. A circuit arrangement for determining a capacitance of a capacitive sensor element comprising:
 a square-wave voltage source which is designed to output a square-wave voltage at an output connection;
 an amplifier branch comprising
  a negative feedback resistor,
  a pnp transistor, and
  an evaluation capacitor,
   wherein the negative feedback resistor, an emitter-collector path of the pnp transistor and the evaluation capacitor are looped-in in series between the output connection of the square-wave voltage source and a ground reference potential, and a voltage providing a measure of the capacitance of the sensor element is present at the evaluation capacitor; and
 a voltage divider, the voltage divider being looped-in between the output connection of the square-wave voltage source and a connection of the capacitive sensor element, wherein a centre tap of the voltage divider is connected to a base connection of the pnp transistor, and
 wherein the square-wave voltage source comprises a zener diode that is looped-in between the output connection of the square-wave voltage source and the reference potential and limits the square-wave voltage to a maximum voltage level.

2. The circuit arrangement according to claim 1, characterized in that the square-wave voltage source comprises a charge pump.

3. The circuit arrangement according to claim 1 wherein the square-wave voltage source is designed to output a square-wave voltage with a voltage swing of greater than 20 V.

4. The circuit arrangement according to claim 1, wherein a discharge resistor is connected in parallel with the evaluation capacitor.

5. The circuit arrangement according to claim 4 wherein a diode is looped-in in the forward direction between the transistor and the evaluation capacitor.

* * * * *